United States Patent
Noda

(10) Patent No.: US 8,772,849 B2
(45) Date of Patent: Jul. 8, 2014

(54) SEMICONDUCTOR MEMORY DEVICE

(75) Inventor: Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 301 days.

(21) Appl. No.: 13/410,608

(22) Filed: Mar. 2, 2012

(65) Prior Publication Data

US 2012/0228687 A1    Sep. 13, 2012

(30) Foreign Application Priority Data

Mar. 10, 2011 (JP) ................................. 2011-052270

(51) Int. Cl.
*H01L 29/76* (2006.01)
*H01L 29/12* (2006.01)

(52) U.S. Cl.
USPC ....... 257/296; 257/43; 257/368; 257/E27.084

(58) Field of Classification Search
USPC ............... 257/43, 296, 368, E27.06, E27.084
See application file for complete search history.

(56) References Cited

U.S. PATENT DOCUMENTS

| | | |
|---|---|---|
| 5,317,432 A | 5/1994 | Ino |
| 5,528,032 A | 6/1996 | Uchiyama |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,690,598 B2 | 2/2004 | Oguchi et al. |
| 6,727,522 B1 | 4/2004 | Kawasaki et al. |
| 6,791,863 B2 | 9/2004 | Oguchi et al. |
| 7,049,190 B2 | 5/2006 | Takeda et al. |
| 7,061,014 B2 | 6/2006 | Hosono et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Kim, "Technology for sub-50nm DRAM and NAND Flash Manufacturing," IEDM 05: Technical Digest of International Electron Devices Meeting, Dec. 5, 2005, pp. 333-336.

(Continued)

*Primary Examiner* — Tuan N. Quach
(74) *Attorney, Agent, or Firm* — Eric J. Robinson; Robinson Intellectual Property Law Office, P.C.

(57) ABSTRACT

A semiconductor memory device includes a semiconductor film; a first gate insulating film covering the semiconductor film; a first gate electrode provided over the semiconductor film with the first gate insulating film interposed therebetween; a first conductive film which is provided over the first gate insulating film; an insulating film which is provided over the first gate insulating film, exposes top surfaces of the first gate electrode and the first conductive film, and has a groove portion between the first gate electrode and the first conductive film; an oxide semiconductor film which is provided over the insulating film and is in contact with the first gate electrode, the first conductive film, and the groove portion; a second gate insulating film covering the oxide semiconductor film; and a second gate electrode provided over the oxide semiconductor film and the groove portion with the second gate insulating film interposed therebetween.

20 Claims, 4 Drawing Sheets

(56) References Cited

U.S. PATENT DOCUMENTS

| | | | |
|---|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,414,278 B2 | 8/2008 | Sugatani et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,389 B2 | 8/2009 | Tanaka |
| 7,674,650 B2 | 3/2010 | Akimoto et al. |
| 7,732,819 B2 | 6/2010 | Akimoto et al. |
| 7,846,826 B2 | 12/2010 | Oyu et al. |
| 7,893,494 B2 | 2/2011 | Chang et al. |
| 8,084,331 B2 | 12/2011 | Ofuji et al. |
| 8,183,099 B2 | 5/2012 | Sakata |
| 8,242,496 B2 * | 8/2012 | Yamazaki et al. ............... 257/43 |
| 8,378,403 B2 * | 2/2013 | Kato ............................. 257/296 |
| 8,654,566 B2 * | 2/2014 | Nagatsuka et al. ........... 365/149 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0084255 A1 | 4/2006 | Oyu et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0256237 A1 | 10/2009 | Kobayashi |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0187410 A1 | 7/2012 | Yamazaki et al. |
| 2012/0187417 A1 | 7/2012 | Yamazaki et al. |
| 2012/0187475 A1 | 7/2012 | Yamazaki et al. |
| 2012/0223305 A1 * | 9/2012 | Sato et al. ..................... 257/43 |
| 2012/0223310 A1 | 9/2012 | Noda et al. |
| 2012/0267696 A1 * | 10/2012 | Isobe et al. ................... 257/296 |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-196647 A | 7/1994 |
| JP | 06-208796 A | 7/1994 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-135350 A | 6/2009 |
| WO | WO-2004/114391 | 12/2004 |

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviiolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensiional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 49, pp. 899-902.

Kanno.H et al., "White Stacked Electrophosphorecent Organic Light-Emitting Devices Employing MOO3 as a Charge-Generation Layer,", Adv. Mater. Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshoops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-DOPED Zinc Indium Oxide Thin Film Transistors for AMOLED Back-Plane,", DID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites For Display Applications,", SID Digest '09 : SID International Symposium Digest of Technical Papers, May 31, 2009, pp. 578-581.

(56) References Cited

OTHER PUBLICATIONS

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symosium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2,2002, vol. 1, pp. 64-68.

Kimizuka.N. et al., "Spinel, YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

SEMICONDUCTOR MEMORY DEVICE

BACKGROUND OF THE INVENTION

1. Field of the Invention

The present invention relates to a semiconductor memory device which includes a circuit including a semiconductor element such as a transistor.

2. Description of the Related Art

Semiconductor memory devices including memory circuits capable of writing, reading, and erasing data have been developed.

As examples of the semiconductor memory device, a semiconductor memory device including a transistor that is a memory element (also referred to as memory transistor) or an element formed using a ferroelectric material, and the like are given (see Patent Document 1 and Patent Document 2).

REFERENCE

[Patent Document 1] Japanese Published Patent Application No. S57-105889

[Patent Document 2] Japanese Published Patent Application No. H06-196647

SUMMARY OF THE INVENTION

However, a conventional semiconductor memory device has a problem that data is lost due to leakage of electric charge after the data is written to a memory transistor. Therefore, refresh operation in which data is written periodically is needed, which results in an increase in power consumption of the semiconductor memory device.

The sizes of elements (e.g., a transistor and a capacitor) included in a semiconductor memory device need to be reduced in order to increase the degree of integration of the semiconductor memory device. When the size of a transistor is reduced in accordance with the scaling law, influence of a short-channel effect cannot be avoided, for example, in the case where the channel length is 100 nm or less, and punch-through leakage current easily flows, which causes a problem that the transistor does not function as a switching element.

An object of one embodiment of the present invention is to increase data retention time of a semiconductor memory device while increasing the degree of integration of the semiconductor memory device.

One embodiment of the present invention is a semiconductor memory device including a first transistor, a second transistor, and a capacitor. One of a source and a drain of the second transistor also serves as a gate of the first transistor and one of capacitor electrodes included in the capacitor.

The semiconductor memory device includes a substrate; a semiconductor film provided over the substrate; a first gate insulating film covering the semiconductor film; a first gate electrode provided over the semiconductor film with the first gate insulating film interposed therebetween; a first conductive film which is provided over the first gate insulating film, does not overlap with the semiconductor film, and is formed from the same layer and of the same material as the first gate electrode; an insulating film which is provided over the first gate insulating film, exposes top surfaces of the first gate electrode and the first conductive film, and has a groove portion exposing the first gate insulating film; an oxide semiconductor film which is provided over the insulating film and is in contact with the first gate insulating film, the first gate electrode, and the first conductive film; a second gate insulating film covering the oxide semiconductor film; a second gate electrode provided over the oxide semiconductor film and the groove portion with the second gate insulating film interposed therebetween; and a second conductive film which is provided over the first gate electrode with the second gate insulating film and the oxide semiconductor film interposed therebetween and is formed from the same layer and of the same material as the second gate electrode.

In the semiconductor memory device, the first gate electrode serves as a gate electrode of the first transistor, one of a source electrode and a drain electrode of the second transistor, and one of capacitor electrodes included in the capacitor. The semiconductor film and the first gate insulating film respectively serve as a channel region and a gate insulating film of the first transistor.

The first conductive film serves as the other of the source electrode and the drain electrode of the second transistor.

The oxide semiconductor film, the second gate insulating film, and the second gate electrode respectively serve as a channel region, a gate insulating film, and a gate electrode of the second transistor.

Note that off-state current of a transistor can be reduced by using an oxide semiconductor film in a channel region of a transistor.

The second gate insulating film and the second conductive film respectively serve as a dielectric film and the other capacitor electrode which are included in the capacitor.

Note that the groove portion provided in the insulating film in order to expose the first gate insulating film is provided for increasing the effective channel length L' of the second transistor. For example, the thickness of the insulating film may be selected so that the effective channel length L' that is the distance between the source electrode and the drain electrode seen in cross section (i.e., the distance between the first conductive film and the first gate electrode along the oxide semiconductor film) is twice or more the apparent channel length L that is the distance between the source electrode and the drain electrode seen from the above (i.e., the straight-line distance between the first conductive film and the first gate electrode). For that purpose, the thickness of the insulating film may be set to one-half or more of the distance between the source electrode and the drain electrode seen from the above. However, the thickness of the insulating film is not limited to the above.

In this specification, in the case where "a first film is formed from the same layer and of the same material as a second film," the second film may be a film extended from the first film, or the first film and the second film may be separated.

By applying one embodiment of the present invention, a semiconductor memory device which holds data for a long period and has a high degree of integration can be provided.

Further, a semiconductor memory device with a high degree of integration can be manufactured; thus, the price per storage capacity of the semiconductor device can be reduced.

By providing a channel region in contact with a groove provided in an insulating film, data retention time of a semiconductor memory device can be increased while increasing the degree of integration of the semiconductor memory device.

DETAILED DESCRIPTION OF THE INVENTION

Figure 1A:
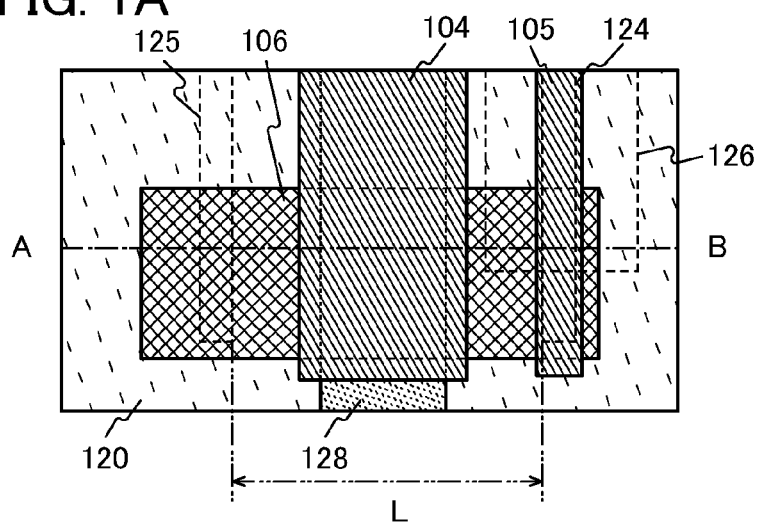
FIGS. 1A to 1D are respectively a top view, a cross-sectional view, a circuit diagram, and a graph showing electrical characteristics of an example of a semiconductor memory device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and scope of the present invention. The present invention is not construed as being limited to description of the embodiments below. In describing structures of the present invention with reference to the drawings, the same reference numerals are used in common for the same portions in different drawings. Note that the same hatch pattern is applied to similar parts, and the similar parts are not particularly denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

Note that voltage refers to a potential difference between a predetermined potential and a reference potential (e.g., a ground potential) in many cases. Therefore, voltage, potential and a potential difference can be referred to as potential, voltage, and a voltage difference, respectively.

Further, in this specification, even when the phrase "A is connected to B" is used, there is a case where no physical connection between A and B is made in an actual circuit and a line is just extended between A and B.

Note that the ordinal numbers such as "first" and "second" in this specification are used for convenience and do not denote the order of steps or the stacking order of layers. In addition, the ordinal numbers in this specification do not denote particular names which specify the present invention.

(Embodiment 1)

In this embodiment, structures of transistors and a capacitor which are included in a nonvolatile memory that is a semiconductor memory device to which one embodiment of the present invention is applied, a circuit configuration, and a manufacturing method of the nonvolatile memory will be described with reference to FIGS. 1A to 1D, FIGS. 2A to 2C, and FIGS. 3A to 3E.

Figure 1B:
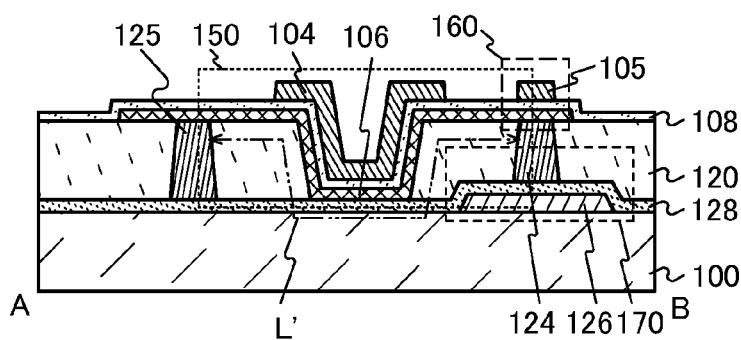

FIG. 1A is a top view of a nonvolatile memory that is a semiconductor memory device. FIG. 1B is a cross section A-B along a dashed-dotted line A-B in FIG. 1A. Note that an insulating film 108 is omitted in FIG. 1A for simplicity.

Figure 1C:
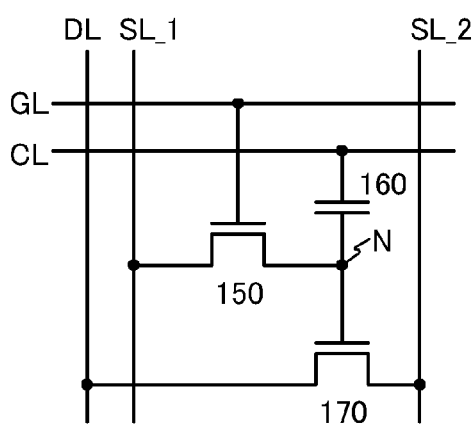

FIG. 1C illustrates a circuit configuration of the nonvolatile memory. The nonvolatile memory includes a transistor 150 with extremely small off-state current, a gate line GL connected to a gate of the transistor 150, a source line SL_1 connected to a source of the transistor 150, a transistor 170, a source line SL_2 connected to a source of the transistor 170, a drain line DL connected to a drain of the transistor 170, a capacitor 160, a capacitor line CL connected to one terminal of the capacitor 160, and a node N connected to the other terminal of the capacitor 160, a drain of the transistor 150, and a gate of the transistor 170.

Figure 1D:
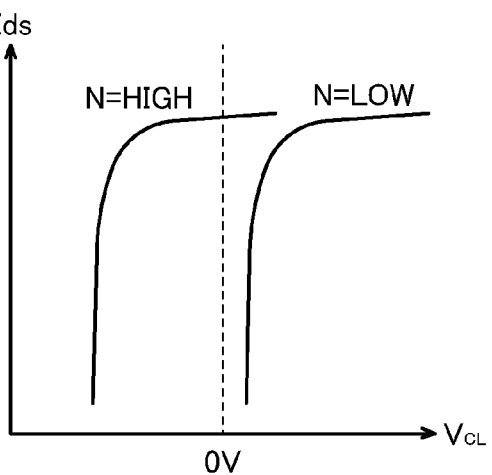

The nonvolatile memory described in this embodiment utilizes a change in the threshold voltage of the transistor 170, which depends on the voltage of the node N. For example, FIG. 1D shows the relation between voltage $V_{CL}$ of the capacitor line CL and drain current Ids flowing through the transistor 170.

The voltage of the node N can be adjusted through the transistor 150. For example, the voltage of the source line SL_1 is set to VDD. In this case, when the voltage of the gate line GL is set to be higher than or equal to the voltage obtained by adding VDD to the threshold voltage Vth of the transistor 150, the voltage of the node N can be HIGH. Further, when the voltage of the gate line GL is set to be lower than or equal to the threshold voltage Vth of the transistor 150, the voltage of the node N can be LOW.

Thus, either a $V_{CL}$-Ids curve for N=LOW or a $V_{CL}$-Ids curve for N=HIGH can be obtained. That is, when N=LOW, the Ids is small at a $V_{CL}$ of 0 V; accordingly, data 0 is stored. Further, when N=HIGH, the Ids is large at a $V_{CL}$ of 0 V; accordingly, data 1 is stored. In this manner, data can be stored.

By using a transistor with an extremely small off-state current as the transistor 150, it is possible to prevent unexpected leakage of electric charge accumulated in the node N through the transistor 150. Thus, data can be held for a long period.

Next, structures of the transistors and the capacitor which are included in the nonvolatile memory that is one embodiment of the present invention will be described with reference to the cross section A-B of FIG. 1B.

The semiconductor memory device includes a substrate 100; a semiconductor film 126 over the substrate 100; an insulating film 128 covering the semiconductor film 126; a conductive film 124 provided over the semiconductor film 126 with the insulating film 128 interposed therebetween; a conductive film 125 which is provided over the insulating film 128, does not overlap with the semiconductor film 126, and is formed from the same layer and of the same material as the conductive film 124; an insulating film 120 which is provided over the insulating film 128, exposes top surfaces of the conductive film 124 and the conductive film 125, and has a groove portion for exposing the insulating film 128; an oxide semiconductor film 106 which is provided over the insulating film 120, and is in contact with a side surface and a bottom surface (the insulating film 128) of the groove portion in the insulating film 120, the conductive film 124, and the conductive film 125; an insulating film 108 covering the oxide semiconductor film 106; a conductive film 104 provided over the oxide semiconductor film 106 and the groove portion in the insulating film 120 with the insulating film 108 interposed therebetween; and a conductive film 105 which overlaps with the conductive film 124 with the insulating film 108 and the oxide semiconductor film 106 interposed therebetween and is formed from the same layer and of the same material as the conductive film 104.

Note that the groove portion provided in the insulating film 120 may expose the substrate 100 instead of the insulating film 128. Moreover, the groove portion is provided between the conductive film 124 and the conductive film 125.

In the transistor 150, the conductive film 124 serves as one of a source electrode and a drain electrode; the conductive film 125 serves as the other of the source electrode and the drain electrode; the oxide semiconductor film 106 includes a channel region; the insulating film 108 serves as a gate insulating film; and the conductive film 104 serves as a gate electrode.

The oxide semiconductor film 106 including a channel region is provided in contact with the groove portion in the insulating film 120. Thus, the effective channel length L' that is the length of the channel region (the oxide semiconductor film 106) seen in cross section (see FIG. 1B) can be longer than the apparent channel length L that is the distance between the source electrode and the drain electrode (the conductive film 124 and the conductive film 125) seen from the above (see FIG. 1A). For example, when the depth of the groove portion provided in the insulating film 120 is set to one-half or more of the distance between the conductive film 124 and the conductive film 125 seen from the above, the effective channel length L' can be twice or more the apparent channel length L. It is preferable that the thickness of the insulating film 120 and the depth of the groove portion be selected so that the effective channel length L' is three times or more, more preferably, four times or more the apparent channel length L. For example, in the case where the apparent channel length L ranges from 15 nm to 100 nm, the depth of the groove portion provided in the insulating film 120 may be set greater than or equal to 7.5 nm and less than or equal to 200 nm. However, the depth of the groove portion provided in the insulating film 120 is not limited to the above range. Needless to say, the effective channel length L' cannot be longer than the apparent channel length L unless the thickness of the oxide semiconductor film 106 is smaller than the depth of the groove portion. Therefore, the depth of the groove portion is set larger than or equal to the thickness of the oxide semiconductor film 106.

Although the groove portion provided in the insulating film 120 exposes the insulating film 128 or the substrate 100, one embodiment of the present invention is not limited thereto. For example, a bottom surface of the groove portion may be located in the insulating film 120. Alternatively, an etch stop film may be additionally provided over the insulating film 128 or the substrate 100 to expose the etch stop film.

The capacitor 160 has the following structure. The conductive film 124 serves as a first capacitor electrode. The insulating film 108 serves as a dielectric film. The conductive film 105 serves as a second capacitor electrode.

The transistor 170 has the following structure. The conductive film 124 serves as a gate electrode. The semiconductor film 126 includes a channel region. The insulating film 128 serves as a gate insulating film. Although not illustrated, a source region and a drain region which have lower resistance than the channel region provided in the semiconductor film 126 is provided in regions in the semiconductor film 126, which do not overlap with the conductive film 124. In addition, the source line SL_2 and the drain line DL which are in contact with the source region and the drain region and are different layers from the conductive film 124 and the conductive film 125 are provided. In addition to the source region and the drain region, a lightly doped drain (LDD) region which has lower resistance than the channel region and has higher resistance than the source region and the drain region may be provided. Providing the LDD region makes it possible to suppress the deterioration of the transistor such as hot carrier degradation caused when a channel length is small and to reduce short-channel effects.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. A single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like can also be used as the substrate 100. Any of these substrates further provided with a semiconductor element may also be used as the substrate 100. The semiconductor element may be the transistor 170.

A flexible substrate may be used as the substrate 100. In that case, a transistor is manufactured directly on the flexible substrate. Note that as a method of providing a transistor over a flexible substrate, there is also a method in which a transistor is manufactured over a non-flexible substrate, and then the transistor is separated and transferred to the substrate 100 which is a flexible substrate. In that case, a separation layer is preferably provided between the non-flexible substrate and the transistor.

The semiconductor film 126 may be formed using a silicon-based material such as amorphous silicon, microcrystalline silicon, polycrystalline silicon, or single crystal silicon, a germanium-based material, a silicon germanium-based material, a gallium arsenide-based material, a carbon-based material, or the like.

Each of the conductive film 124, the conductive film 125, the conductive film 104, and the conductive film 105 may be formed as a single layer or a stacked layer using any one or more of Al, Ti, Cr, Co, Ni, Cu, Y, Zr, Mo, Ag, Ta, W, a nitride thereof, an oxide thereof, and an alloy thereof. In the case where an oxide is used for the conductive film 104, the oxide may contain nitrogen at higher than or equal to $5\times10^{19}$ cm$^{-3}$ and lower than or equal to 20 atomic %, or higher than or equal to $1\times10^{20}$ cm$^{-3}$ and lower than or equal to 7 atomic %. For example, an oxide film which contains nitrogen at higher than or equal to $1\times10^{20}$ cm$^{-3}$ and lower than or equal to 7 atomic % and also contains In, Ga, and Zn may be used. In the case where an oxide film is used as the conductive film 104, the oxide film has higher resistance than a metal film; thus, it is preferable to provide a stacked-layer structure of the oxide film and a low-resistance film having a sheet resistance lower than or equal to 10 Ω/sq in order to reduce the resistance of the whole gate electrode. Note that the concentration represented by a unit of cm$^{-3}$ can be quantified by secondary ion mass spectrometry (SIMS) analysis and that the concentration represented by a unit of atomic % can be quantified by X-ray photoelectron spectroscopy (XPS) analysis.

The thickness of the oxide semiconductor film 106 is greater than or equal to 6 nm and less than or equal to 100 nm, preferably greater than or equal to 15 nm and less than or equal to 40 nm According to the scaling law, it is preferable that the thickness of the oxide semiconductor film 106 be reduced when the channel length of the transistor 150 is reduced. However, by applying one embodiment of the present invention, the effective channel length L' can be increased with the apparent channel length L kept short. Thus, the thickness of the oxide semiconductor film 106 can be in the above range.

The oxide semiconductor film 106 can be formed by a sputtering method, a plasma CVD method, a pulse laser deposition (PLD) method, a molecular beam epitaxy (MBE) method, an evaporation method, or the like using a material containing two or more of In, Ga, Zn, and Sn, for example.

As a material used for the oxide semiconductor film 106, any of the following may be used, for example: a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; and the like. Here, for example, an In—Ga—Zn—O-based material means oxide containing indium (In), gallium (Ga), and zinc (Zn), and there is no particular limitation on the composition ratio. Further, the In—Ga—Zn—O-based oxide semiconductor may contain an element other than In, Ga, and Zn. In this case, the amount of oxygen in the oxide semiconductor film 106 is preferably in excess of the stoichiometric amount. When the amount of oxygen is in excess of the stoichiometric amount, generation of carriers which results from oxygen deficiency in the oxide semiconductor can be suppressed.

For example, in the case where an In—Zn—O-based material is used for the oxide semiconductor film 106, the atomic ratio of In to Zn is in the range of 0.5:1 to 50:1, preferably 1:1 to 20:1, more preferably 1.5:1 to 15:1. When the atomic ratio of In to Zn is in the above range, the field effect mobility of the transistor can be improved. Here, when the atomic ratio of the compound is In:Zn:O=X:Y:Z, it is preferable to satisfy the relation $Z>1.5X+Y$.

A material represented by $InMO_3(ZnO)_m$ (m>0) may be used for the oxide semiconductor film 106. Here, M represents one or more metal elements selected from Ga, Al, Mn, and Co. For example, M may be Ga, Ga and Al, Ga and Mn, Ga and Co, or the like.

A material having a band gap greater than or equal to 2.5 eV, preferably greater than or equal to 3.0 eV, is selected for the oxide semiconductor film 106. When the band gap is large, excitation of carriers from the valence band to the conduction band by heat or the like is less likely to occur; thus, current due to the excitation of carriers is less likely to be generated. In addition, the amount of impurities which form a level, or the like contained in the oxide semiconductor film 106 is preferably small.

In the oxide semiconductor film 106, hydrogen, an alkali metal, an alkaline earth metal, and the like are reduced and the concentration of impurities is very low. Therefore, in a transistor whose channel region is formed using the oxide semiconductor film 106, off-state current can be reduced.

The concentration of hydrogen in the oxide semiconductor film 106 is lower than $5\times10^{18}$ cm$^{-3}$, preferably lower than or equal to $1\times10^{18}$ cm$^{-3}$, more preferably lower than or equal to $5\times10^{17}$ cm$^{-3}$, further preferably lower than or equal to $1\times10^{16}$ cm$^{-3}$.

An alkali metal is not an element constituting an oxide semiconductor, and therefore, is an impurity. Also, an alkaline earth metal is an impurity in the case where the alkaline earth metal is not included in an oxide semiconductor. Among alkali metals, in particular, sodium (Na) is diffused into an insulating film in contact with the oxide semiconductor film to become Na$^+$. Further, in the oxide semiconductor film, Na cuts or enters a bond between a metal and oxygen which are included in an oxide semiconductor. As a result, for example, deterioration of characteristics of the transistor, such as a normally-on state of the transistor due to shift of a threshold voltage in the negative direction, or a reduction in field-effect mobility, occurs; in addition, a variation in characteristics is also caused. Such deterioration of the characteristics of the transistor and variation in the characteristics due to the impurity remarkably appear when the concentration of hydrogen in the oxide semiconductor film is very low. Thus, when the concentration of hydrogen in the oxide semiconductor film is lower than or equal to $1\times10^{18}$ cm$^{-3}$ or lower than or equal to $1\times10^{17}$ cm$^{-3}$, the concentration of the impurities is preferably lowered. Specifically, the measurement value of the concentration of Na is less than or equal to $5\times10^{16}$ cm$^{-3}$, preferably less than or equal to $1\times10^{16}$ cm$^{-3}$, more preferably less than or equal to $1\times10^{15}$ cm$^{-3}$. The measurement value of the concentration of lithium (Li) is less than or equal to $5\times10^{15}$ cm$^{-3}$, preferably less than or equal to $1\times10^{15}$ cm$^{-3}$. The measurement value of the concentration of potassium (K) is less than or equal to $5\times10^{15}$ cm$^{-3}$, preferably less than or equal to $1\times10^{15}$ cm$^{-3}$.

The use of the above oxide semiconductor film 106 for a channel region of a transistor allows the off-state current of the transistor to be reduced. Specifically, the use of the oxide semiconductor film 106 allows the off-state current of the transistor with a channel length of 3 μm and a channel width of 1 μm to be lower than or equal to $1\times10^{-18}$ A, lower than or equal to $1\times10^{-21}$ A, or lower than or equal to $1\times10^{-24}$ A.

The oxide semiconductor film 106 can be in a single crystal state, a polycrystalline (also referred to as polycrystal) state, an amorphous state, or the like.

The oxide semiconductor film 106 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electrical characteristics of the transistor due to irradiation with visible light or ultraviolet light can be reduced. Thus, the transistor has high reliability.

The equivalent oxide thickness (the equivalent silicon oxide thickness) of the insulating film 108 is set greater than or equal to 0.5 nm and less than or equal to 50 nm, preferably greater than or equal to 5 nm and less than or equal to 30 nm It is preferable that the thickness of the insulating film 108 be reduced in accordance with the scaling law when the channel length of the transistor 150 is reduced. However, by applying one embodiment of the present invention, the effective channel length L' can be increased with the apparent channel length L kept short. Thus, the thickness of the insulating film 108 can be in the above range.

The insulating film 128, the insulating film 120, and the insulating film 108 may each be, for example, formed as a stacked layer or a single layer using silicon oxide, silicon oxynitride, silicon nitride oxide, silicon nitride, aluminum oxide, hafnium oxide, yttrium oxide, zirconium oxide, or the like. For example, the insulating film 128, the insulating film 120, and the insulating film 108 may each be formed by a thermal oxidation method, a plasma CVD method, a sputtering method, or the like.

It is preferable that the insulating film 128 serve as an etch stop film when the insulating film 120 is processed. For that reason, materials which are etched at different etching rates at the time of processing are preferably selected for the insulating film 120 and the insulating film 128. Different materials may be selected for the insulating film 120 and the insulating film 128: for example, a silicon oxide film is used as the insulating film 128 and a silicon nitride film is used as the insulating film 120.

A film from which oxygen is released by heat treatment is preferably used as each of the insulating film 128, the insulating film 120, and the insulating film 108. The use of a film from which oxygen is released by heat treatment makes it possible to repair defects generated in the oxide semiconductor film 106 and the vicinities of interfaces between the oxide semiconductor film 106 and the insulating films 128, 120, and 108; thus, deterioration in electrical characteristics of the transistor can be suppressed.

"Oxygen is released by heat treatment" means that the amount of released oxygen which is converted into oxygen atoms is greater than or equal to $1.0 \times 10^{18}$ atoms/cm$^3$, or greater than or equal to $3.0 \times 10^{20}$ atoms/cm$^3$ in thermal desorption spectroscopy (TDS).

Here, a method in which the amount of released oxygen is measured by being converted into oxygen atoms in TDS analysis is described.

The amount of released gas in TDS analysis is proportional to the integral value of ion intensity in a predetermined temperature range. Therefore, the amount of released gas can be calculated from the ratio between the measured integral value of ion intensity and the reference value of a standard sample. The reference value of a standard sample refers to a ratio of the density of predetermined atoms contained in a sample to the integral value of ion intensity corresponding to the predetermined atoms.

For example, the number of released oxygen molecules ($N_{O2}$) from an insulating film can be found according to an equation 1 with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2} \times S_{O2} \times \alpha \quad \text{(Equation 1)}$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. For details of Equation 1, Japanese Published Patent Application No. H6-275697 is referred to. Note that the amount of released oxygen from the above insulating film was measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of oxygen molecules, the number of the released oxygen atoms can be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heat treatment may be oxygen-excess silicon oxide (SiO$_X$(X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen to the oxide semiconductor film 106 from the insulating film 128, the insulating film 120, and the insulating film 108, the interface state density between the oxide semiconductor film 106 and the insulating film 128, the interface state density between the oxide semiconductor film 106 and the insulating film 120, and the interface state density between the oxide semiconductor film 106 and the insulating film 108 can be reduced. As a result, carrier trapping due to operation of the transistor or the like at the interface between the oxide semiconductor film 106 and the insulating film 128, the interface between the oxide semiconductor film 106 and the insulating film 120, or the interface between the oxide semiconductor film 106 and the insulating film 108 can be suppressed; thus, a transistor with good electrical characteristics can be obtained.

Further, electric charge is generated due to oxygen deficiency in the oxide semiconductor film 106 in some cases. In general, part of oxygen deficiency in an oxide semiconductor film serves as a donor and causes release of an electron which is a carrier. As a result, the threshold voltage of a transistor shifts in the negative direction. By supplying sufficient oxygen to the oxide semiconductor film 106 from the insulating film 128, the insulating film 120, and the insulating film 108, oxygen deficiency in the oxide semiconductor film which causes the shift of the threshold voltage in the negative direction can be reduced.

The oxide semiconductor film 106 is used in the thus obtained transistor 150, whereby the off-state current can be reduced; thus, a nonvolatile memory capable of holding electric charge accumulated in the capacitor 160 for a long period can be provided. Moreover, since the transistor 150 operates less frequently, it has less deterioration in electrical characteristics; thus, a highly reliable nonvolatile memory can be provided.

Further, the groove portion is provided in the insulating film 120 and the oxide semiconductor film 106 in contact with the groove portion is formed, whereby the effective channel length L' can be twice or more, preferably three times or more, more preferably, four times or more the apparent channel length L that is the distance between the conductive film 124 and the conductive film 125 in a top view. Thus, influence of a short-channel effect can be reduced even when the size of the transistor 150 is reduced, which allows the degree of integration of a nonvolatile memory to be increased.

Next, a structure of the nonvolatile memory illustrated in FIGS. 1A to 1D without the capacitor will be described with reference to FIGS. 2A to 2C.

Figure 2A:
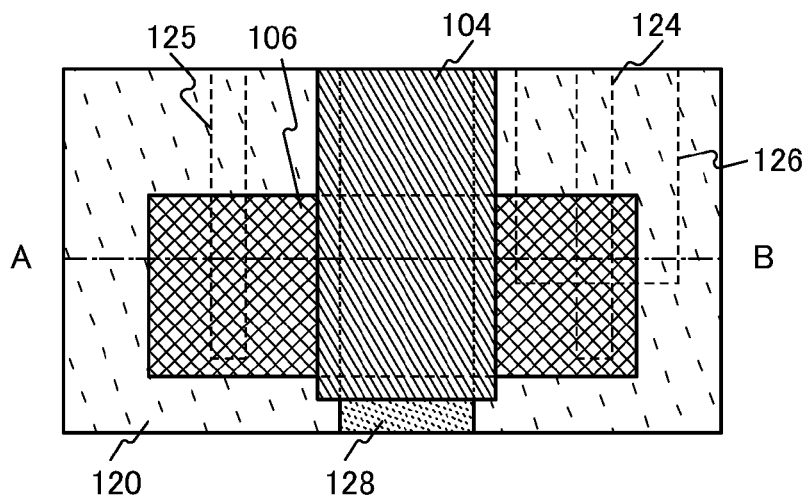
FIGS. 2A to 2C are respectively a top view, a cross-sectional view, and a circuit diagram of an example of a semiconductor memory device according to one embodiment of the present invention.
Figure 2B:
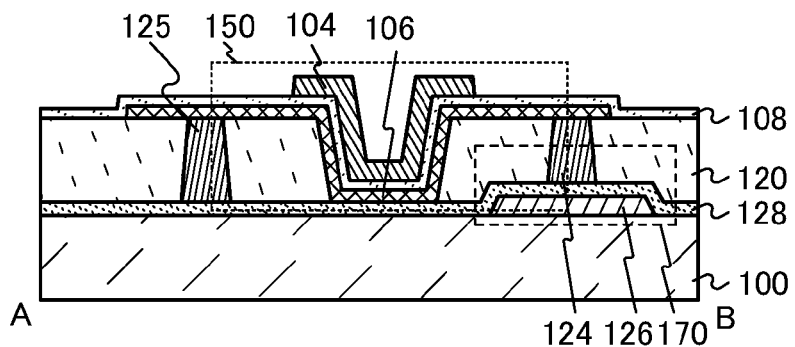
Figure 2C:
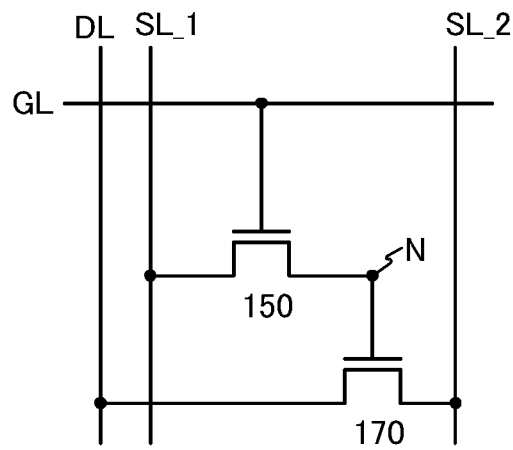

FIG. 2C is a circuit diagram of a nonvolatile memory. The nonvolatile memory includes the transistor 150, the gate line GL connected to the gate of the transistor 150, the source line SL_1 connected to the source of the transistor 150, the transistor 170, the source line SL_2 connected to the source of the transistor 170, the drain line DL connected to the drain of the transistor 170, and the node N connected to the drain of the transistor 150 and the gate of the transistor 170.

In the case where a transistor with small off-state current is used as the transistor 150, electric charge can be held in the node N between the drain of the transistor 150 and the gate of the transistor 170 without providing a capacitor. Since a capacitor is not provided, a capacitor line and the like are not provided, which results in a reduction in area. Therefore, the degree of integration can be higher than that in the case where a capacitor is provided.

Although the nonvolatile memory including four or five lines is described in this embodiment, the structure of the nonvolatile memory is not limited thereto. For example, a structure in which one line serves as the source line SL_1 and the drain line DL_2 may be employed.

The nonvolatile memories described in this embodiment may be combined and integrated to manufacture a memory cell array. In that case, an address line or the like is added as appropriate. By applying the nonvolatile memory described in this embodiment, the degree of integration of a memory cell array can be increased.

Next, an example of a manufacturing method of the transistor 150, the capacitor 160, and the transistor 170 which are described in this embodiment will be described with reference to FIGS. 3A to 3E.

First, the semiconductor film 126 is formed over the substrate 100. Then, the insulating film 128 is formed (see FIG. 3A).

Figure 3A:
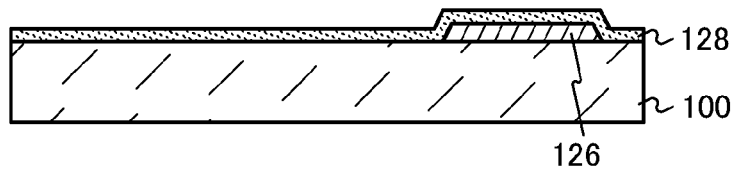
FIGS. 3A to 3E are cross-sectional views illustrating an example of a manufacturing method of a semiconductor memory device according to one embodiment of the present invention.
Figure 3B:
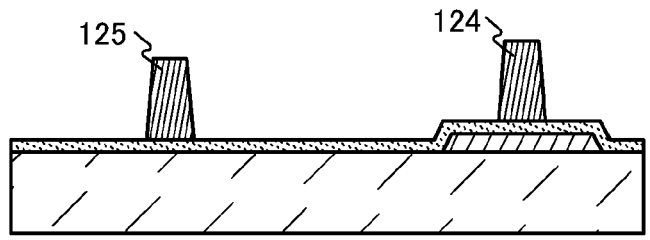

Next, the conductive film 124 and the conductive film 125 are formed (see FIG. 3B). Note that after the conductive film 124 and the conductive film 125 are formed, impurities which generate carriers (phosphorus, arsenic, boron, or the like in the case of a silicon-based material) may be added to the semiconductor film 126 by an ion implantation method or an ion doping method using the conductive film 124 as a mask. When the impurities are added to the semiconductor film 126, a source region and a drain region, or an LDD region can be formed.

Figure 3C:
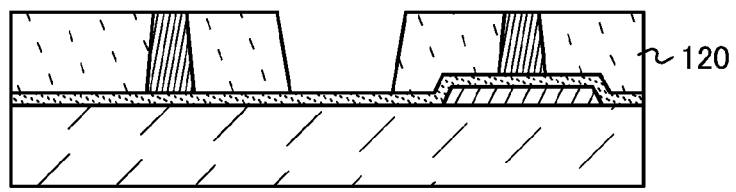
Figure 3D:
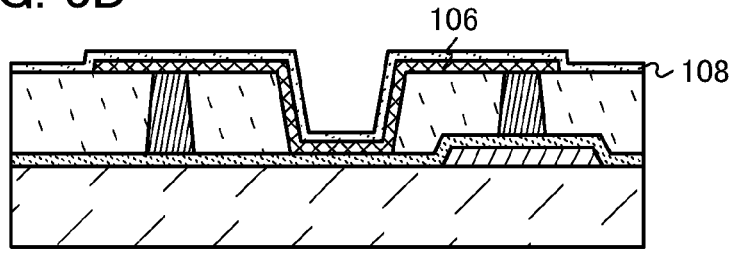

Next, the insulating film 120 is formed (see FIG. 3C). The insulating film 120 can be formed in such a manner that an insulating film is formed, the insulating film is subjected to chemical mechanical polishing (CMP) or etch back, and then a groove portion for exposing the insulating film 128 is provided in a photolithography step. Alternatively, the insulating film 120 can be formed in such a manner that a groove portion for exposing the insulating film 128 is formed in a photolithography step, and then the conductive film 124 and the conductive film 125 are exposed by CMP or etch back. Note that parts of the conductive film 124 and the conductive film 125 may be removed by the CMP or the etch back.

"Etch back" refers to a process in which a planarization film is formed on a surface of an uneven film and the uneven film is etched together with the planarization film by etching with high anisotropy (e.g., dry etching), whereby the unevenness of the film is reduced. Alternatively, "etch back" simply refers to an etching step in which a film formed on an entire surface is etched until part of the surface on which the film is formed is exposed.

Next, an oxide semiconductor film is formed and a photolithography step is performed, so that the oxide semiconductor film 106 is formed. It is preferable that plasma treatment such as reverse sputtering be performed before the formation of the oxide semiconductor film 106 so that a corner of the groove portion in the insulating film 120 in a cross-sectional shape is rounded off. As a result, the coverage of the groove portion in the insulating film 120 with the oxide semiconductor film 106 is improved, so that defects of the electrical characteristics of the transistor 150 can be reduced. Then, the insulating film 108 is formed (see FIG. 3D). Note that heat treatment may be performed either after the formation of the oxide semiconductor film serving as the oxide semiconductor film 106 or after the formation of the insulating film 108 or at both timings. Heat treatment is performed at a temperature higher than or equal to 150° C. and lower than or equal to 650° C., preferably higher than or equal to 250° C. and lower than or equal to 450° C. By performing heat treatment, oxygen is released from the insulating film 128, the insulating film 120, or the insulating film 108, so that defects in the oxide semiconductor film 106 and in the vicinity of an interface between the oxide semiconductor film 106 and the insulating film 128, 120, or 108 can be reduced. Note that this heat treatment may be performed immediately after the formation of a conductive film 144 or at any timing after the formation of the insulating film 108 without limitation to the timing immediately after the formation of the insulating film 108.

Figure 3E:
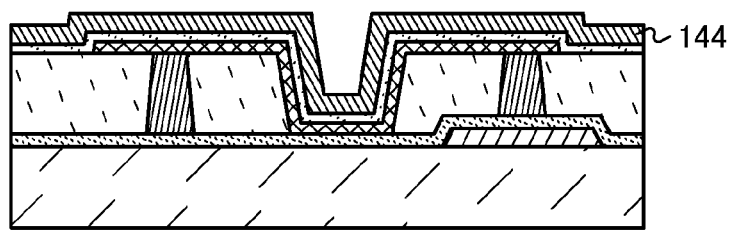

Next, the conductive film 144 is formed (see FIG. 3E). Then, the conductive film 144 is processed to form the conductive film 104 overlapping with the oxide semiconductor film 106 and the conductive film 105 overlapping with the conductive film 124 (see FIG. 1B). Here, impurities which generate carriers directly or indirectly (e.g., hydrogen, helium, neon, argon, krypton, xenon, nitrogen, or phosphorus) may be added to the oxide semiconductor film 106 by an ion implantation method or an ion doping method using the conductive film 104 as a mask. The impurities are added to the oxide semiconductor film 106, so that a source region and a drain region, or an LDD region can be formed.

Through the above steps, the transistor 150, the capacitor 160, and the transistor 170 which are illustrated in FIGS. 1A to 1C can be manufactured.

Note that in order to manufacture the transistor 150 and the transistor 170 which are illustrated in FIGS. 2A to 2C, the conductive film 105 is not formed during the manufacturing process of the transistors, which is illustrated in FIG. 1B.

As described above, the transistor 150, the capacitor 160, and the transistor 170 can be manufactured at the same time; thus, the number of photolithography steps for manufacturing a nonvolatile memory can be reduced.

In the above manner, by applying a three-dimensional shape, a nonvolatile memory that is a semiconductor memory device in which influence of a short-channel effect is reduced even when the degree of integration is increased and an increase in the number of photolithography steps is suppressed can be provided.

This embodiment can be implemented in appropriate combination with the other embodiments.

(Embodiment 2)

In this embodiment, examples of electronic devices to which Embodiment 1 is applied will be described.

Figure 4A:
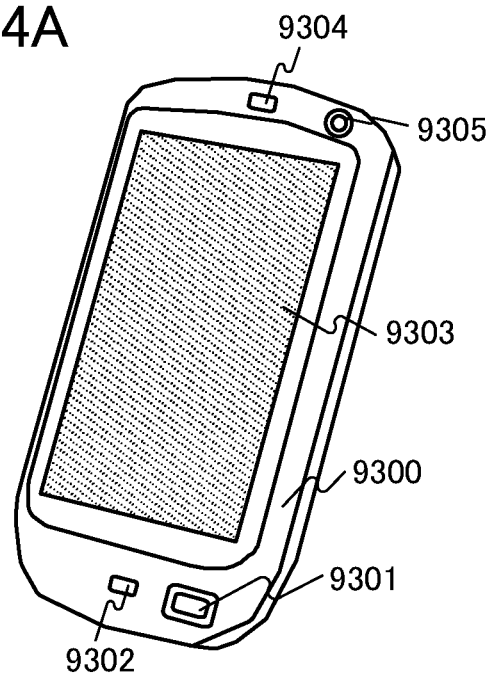
FIGS. 4A and 4B are perspective views each illustrating an example of an electronic device including a semiconductor memory device according to one embodiment of the present invention.
Figure 4B:
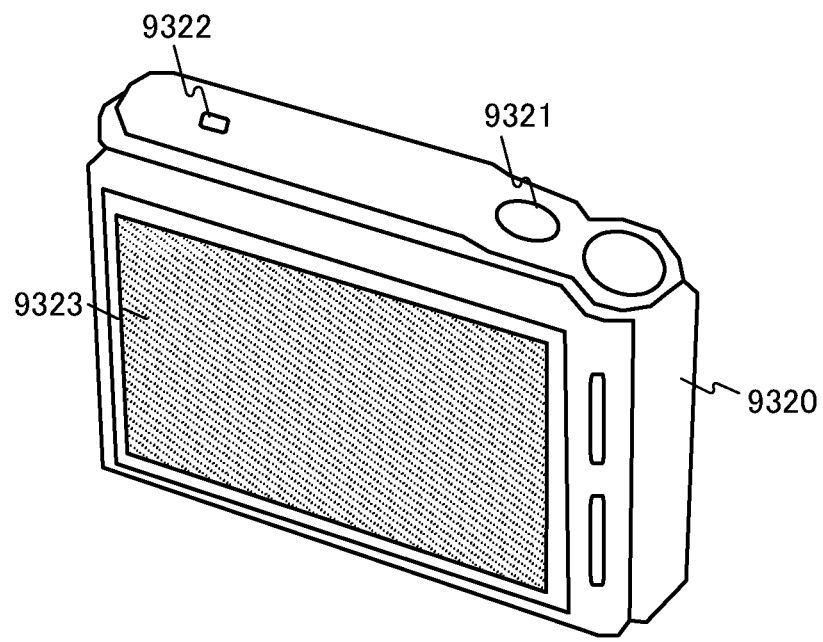

FIG. 4A illustrates a portable information terminal The portable information terminal includes a housing 9300, a button 9301, a microphone 9302, a display portion 9303, a speaker 9304, and a camera 9305, and has a function as a mobile phone. One embodiment of the present invention can be applied to a memory module inside the portable information terminal FIG. 4B illustrates a digital still camera. The digital still camera includes a housing 9320, a button 9321, a microphone 9322, and a display portion 9323. One embodiment of the present invention can be applied to a memory module inside the digital still camera.

The use of one embodiment of the present invention makes it possible to reduce power consumption of electronic devices and to reduce the costs of the electronic devices.

This embodiment can be implemented in appropriate combination with the other embodiments.

This application is based on Japanese Patent Application serial no. 2011-052270 filed with Japan Patent Office on Mar. 10, 2011, the entire contents of which are hereby incorporated by reference.

What is claimed is:

1. A semiconductor memory device comprising:
a semiconductor layer;
a first gate insulating layer over the semiconductor layer;
an insulating layer over the first gate insulating layer;
a first gate electrode over the semiconductor layer with the first gate insulating layer interposed therebetween, wherein the first gate electrode is provided in the insulating layer;
a conductive layer provided in the insulating layer;
an oxide semiconductor layer in contact with the first gate electrode, the conductive layer, and side surfaces of a groove portion in the insulating layer;
a second gate insulating layer covering the oxide semiconductor layer; and
a second gate electrode provided over the oxide semiconductor layer with the second gate insulating layer interposed therebetween.

2. The semiconductor memory device according to claim 1, wherein the groove portion is provided between the first gate electrode and the conductive layer.

3. The semiconductor memory device according to claim 1, wherein a top surface of the first gate electrode and a top surface of the conductive layer are aligned with a surface of the insulating layer.

4. The semiconductor memory device according to claim 1, wherein the oxide semiconductor layer is in contact with a bottom surface of the groove portion.

5. The semiconductor memory device according to claim 1, wherein a depth of the groove portion is at least one-half of a distance between the first gate electrode and the conductive layer seen from the above.

6. The semiconductor memory device according to claim 1, wherein the conductive layer is formed from the same layer and of the same material as the first gate electrode.

7. The semiconductor memory device according to claim 1, wherein the oxide semiconductor layer comprises a crystal having a c-axis substantially perpendicular to a surface of the oxide semiconductor layer.

8. A semiconductor memory device comprising:
a semiconductor layer;
a first gate insulating layer over the semiconductor layer;
an insulating layer over the first gate insulating layer;
a first gate electrode over the semiconductor layer with the first gate insulating layer interposed therebetween, wherein the first gate electrode is provided in the insulating layer;
a first conductive layer provided in the insulating layer;
an oxide semiconductor layer in contact with the first gate electrode, the first conductive layer, and side surfaces of a groove portion in the insulating layer;
a second gate insulating layer covering the oxide semiconductor layer;
a second gate electrode provided over the oxide semiconductor layer with the second gate insulating layer interposed therebetween; and
a capacitor comprising a second conductive layer formed from the same layer and of the same material as the second gate electrode,
wherein the oxide semiconductor layer and the second gate insulating layer are interposed between the second conductive layer and the first gate electrode.

9. The semiconductor memory device according to claim 8, wherein the groove portion is provided between the first gate electrode and the first conductive layer.

10. The semiconductor memory device according to claim 8, wherein a top surface of the first gate electrode and a top surface of the first conductive layer are aligned with a surface of the insulating layer.

11. The semiconductor memory device according to claim 8, wherein the oxide semiconductor layer is in contact with a bottom surface of the groove portion.

12. The semiconductor memory device according to claim 8, wherein a depth of the groove portion is at least one-half of a distance between the first gate electrode and the first conductive layer seen from the above.

13. The semiconductor memory device according to claim 8, wherein the first conductive layer is formed from the same layer and of the same material as the first gate electrode.

14. The semiconductor memory device according to claim 8, wherein the oxide semiconductor layer comprises a crystal having a c-axis substantially perpendicular to a surface of the oxide semiconductor layer.

15. A semiconductor memory device comprising:
a semiconductor layer;
a first gate insulating layer over the semiconductor layer;
an insulating layer over the first gate insulating layer;

a first gate electrode over the semiconductor layer with the first gate insulating layer interposed therebetween, wherein the first gate electrode is provided in the insulating layer;

a conductive layer provided in the insulating layer;

an oxide semiconductor layer in contact with the first gate electrode, the conductive layer, side surfaces of a groove portion in the insulating layer, and the first gate insulating layer;

a second gate insulating layer covering the oxide semiconductor layer; and a second gate electrode provided over the oxide semiconductor layer with the second gate insulating layer interposed therebetween.

16. The semiconductor memory device according to claim 15, wherein the groove portion is provided between the first gate electrode and the conductive layer.

17. The semiconductor memory device according to claim 15, wherein a top surface of the first gate electrode and a top surface of the conductive layer are aligned with a surface of the insulating layer.

18. The semiconductor memory device according to claim 15, wherein a depth of the groove portion is at least one-half of a distance between the first gate electrode and the conductive layer seen from the above.

19. The semiconductor memory device according to claim 15, wherein the conductive layer is formed from the same layer and of the same material as the first gate electrode.

20. The semiconductor memory device according to claim 15, wherein the oxide semiconductor layer comprises a crystal having a c-axis substantially perpendicular to a surface of the oxide semiconductor layer.

* * * * *